United States Patent
Kawano

(10) Patent No.: US 9,880,211 B2
(45) Date of Patent: Jan. 30, 2018

(54) SEMICONDUCTOR INTEGRATED CIRCUIT

(71) Applicant: FUJITSU LIMITED, Kawasaki-shi, Kanagawa (JP)

(72) Inventor: Yoichi Kawano, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 34 days.

(21) Appl. No.: 15/058,757

(22) Filed: Mar. 2, 2016

(65) Prior Publication Data

US 2016/0266187 A1 Sep. 15, 2016

(30) Foreign Application Priority Data

Mar. 9, 2015 (JP) .................. 2015-046124

(51) Int. Cl.
| | |
|---|---|
| *G01R 31/00* | (2006.01) |
| *G01R 29/26* | (2006.01) |
| *G01R 31/28* | (2006.01) |
| *H03B 1/00* | (2006.01) |

(52) U.S. Cl.
CPC ......... *G01R 29/26* (2013.01); *G01R 31/2822* (2013.01); *G01R 31/2884* (2013.01); *H03B 1/00* (2013.01); *H03B 2200/00* (2013.01); *H03L 2207/00* (2013.01)

(58) Field of Classification Search
CPC ......... H03B 1/00; H03B 2200/00; H03J 1/00; H03J 2200/00; H03L 1/00; H03L 2207/00
See application file for complete search history.

(56) References Cited

U.S. PATENT DOCUMENTS

| | | | | |
|---|---|---|---|---|
| 4,388,849 | A | * 6/1983 | Hamada | ............... G10H 3/06 714/746 |
| 2007/0222529 | A1 | * 9/2007 | Carichner | ............. H03L 1/00 331/44 |
| 2009/0146719 | A1 | * 6/2009 | Pernia | .................. H03B 5/04 327/291 |
| 2012/0154066 | A1 | * 6/2012 | Kubota | ................. H03B 5/06 331/116 FE |
| 2012/0221616 | A1 | * 8/2012 | Yasuda | .................. H03K 3/84 708/251 |
| 2012/0242419 | A1 | * 9/2012 | Tsai | ..................... H03L 5/00 331/109 |

FOREIGN PATENT DOCUMENTS

| | | |
|---|---|---|
| JP | 10-240370 | 9/1998 |
| JP | 2001-154754 | 6/2001 |
| JP | 2004-318711 | 11/2004 |

\* cited by examiner

*Primary Examiner* — Jermele M Hollington
*Assistant Examiner* — Temilade Rhodes-Vivour
(74) *Attorney, Agent, or Firm* — Fujitsu Patent Center

(57) ABSTRACT

A semiconductor integrated circuit includes a harmonic oscillator circuit, a first switch circuit configured to cause an oscillating state of the harmonic oscillator circuit to switch between an "on" state and an "off" state, a detector circuit configured to produce a voltage responsive to an amplitude of the oscillating output of the harmonic oscillator circuit, a decision circuit configured to detect whether the voltage produced by the detector circuit exceeds a threshold in synchronization with a clock signal, and a second switch circuit configured to control whether or not to apply noise from a noise source to the harmonic oscillator circuit.

6 Claims, 10 Drawing Sheets

SEMICONDUCTOR INTEGRATED CIRCUIT

CROSS-REFERENCE TO RELATED APPLICATIONS

The present application is based upon and claims the benefit of priority from the prior Japanese Patent Application No. 2015-046124 filed on Mar. 9, 2015, with the Japanese Patent Office, the entire contents of which are incorporated herein by reference.

FIELD

The disclosures herein relate to a semiconductor integrated circuit and a method of measuring noise.

BACKGROUND

One of the performance measures of an RF (radio frequency) circuit is noise figure. Since noise figure relates to signal-reception sensitivity, a product equipped with an RF circuit is subjected to noise figure evaluation at the time of shipment in order to ensure that the noise figure is within the specification range.

In the case of an automotive radar utilizing a 77-GHz band, for example, the noise of an RF circuit is measured in the high-frequency region around 77 GHz. Such measurement involves the use of an expensive evaluation apparatus such as a spectrum analyzer for the purpose of evaluating noise in high-frequency range, which leads to an increase in the manufacturing cost. In order to reduce cost, it is desirable to provide a mechanism for measuring noise levels inside an RF chip without resort to the use of an expensive evaluation apparatus.

Noise power levels are extremely low in the case of thermal noise at room temperature. Measuring noise power thus involves the use of a high-gain and low-noise amplifier that can amplify minute noise signals by a large factor. It is difficult, however, to provide such a high-quality amplifier embedded in a chip by using the inexpensive Si-CMOS process. Conventionally, an amplifier module utilizing a compound semiconductor is provided as an embedded element in an evaluation device to perform noise evaluation.

[Patent Document 1] Japanese Laid-open Patent Publication No. 2004-318711

[Patent Document 2] Japanese Laid-open Patent Publication No. 2001-154754

[Patent Document 3] Japanese Laid-open Patent Publication No. H10-240370

SUMMARY

According to an aspect of the embodiment, a semiconductor integrated circuit includes a harmonic oscillator circuit, a first switch circuit configured to cause an oscillating state of the harmonic oscillator circuit to switch between an "on" state and an "off" state, a detector circuit configured to produce a voltage responsive to an amplitude of the oscillating output of the harmonic oscillator circuit, a decision circuit configured to detect whether the voltage produced by the detector circuit exceeds a threshold in synchronization with a clock signal, and a second switch circuit configured to control whether or not to apply noise from a noise source to the harmonic oscillator circuit.

According to an aspect of the embodiment, a semiconductor integrated circuit includes a first noise detecting circuit and a second noise detecting circuit, wherein each of the first noise detecting circuit and the second noise detecting circuit includes a harmonic oscillator circuit, a first switch circuit configured to cause an oscillating state of the harmonic oscillator circuit to switch between an "on" state and an "off" state, a detector circuit configured to produce a voltage responsive to an amplitude of the oscillating output of the harmonic oscillator circuit, a decision circuit configured to detect whether the voltage produced by the detector circuit exceeds a threshold in synchronization with a clock signal, and a second switch circuit configured to control whether or not to apply noise from a noise source to the harmonic oscillator circuit, wherein an oscillating frequency of the harmonic oscillator circuit of the first noise detecting circuit and an oscillating frequency of the harmonic oscillator circuit of the second noise detecting circuit are different from each other.

According to an aspect of the embodiment, a method for measuring noise includes initiating an oscillation of a harmonic oscillator circuit in a first state in which noise from a noise source is not applied to the harmonic oscillator circuit, measuring, in the first state, a time length from the initiation of the oscillation to a point in time at which an output of the harmonic oscillator circuit first exceeds a predetermined threshold, initiating an oscillation of the harmonic oscillator circuit in a second state in which noise from the noise source is applied to the harmonic oscillator circuit, and measuring, in the second state, a time length from the initiation of the oscillation to a point in time at which an output of the harmonic oscillator circuit first exceeds the predetermined threshold.

The object and advantages of the embodiment will be realized and attained by means of the elements and combinations particularly pointed out in the claims. It is to be understood that the foregoing general description and the following detailed description are exemplary and explanatory and are not restrictive of the invention, as claimed.

DESCRIPTION OF EMBODIMENTS

In the following, embodiments of the invention will be described with reference to the accompanying drawings. In these drawings, the same or corresponding elements are referred to by the same or corresponding numerals, and a description thereof will be omitted as appropriate.

Figure 1:
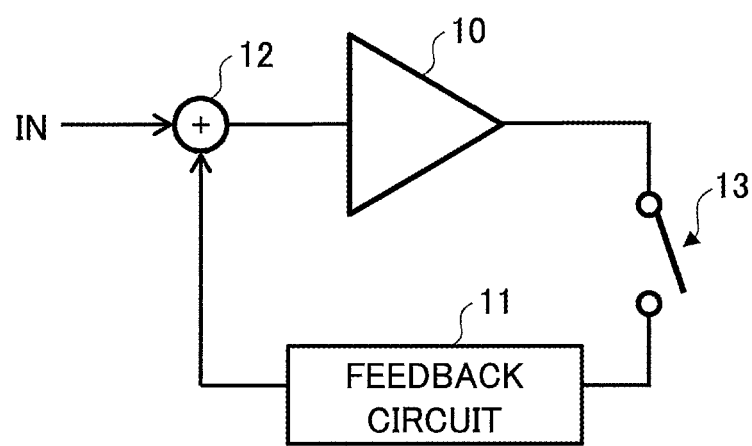
FIG. 1 is a drawing illustrating an example of the configuration of a harmonic oscillator circuit.

FIG. 1 is a drawing illustrating an example of the configuration of a harmonic oscillator circuit. The harmonic oscillator circuit illustrated in FIG. 1 includes an amplifier circuit 10, a feedback circuit 11, an adder circuit 12, and a switch circuit 13. The switch circuit 13 causes the oscillating state of the harmonic oscillator circuit to switch between the on state and the "off" state by causing the feedback path forming a feedback loop to switch between the conductive state and the nonconductive state. The conductive state of the switch circuit 13 serves to form the feedback loop, thereby placing the harmonic oscillator circuit in the oscillating state. The nonconductive state of the switch circuit 13 serves to break the feedback loop, thereby placing the harmonic oscillator circuit in the non-oscillating state (inactive state).

The adder circuit 12 adds together an input signal applied to an input terminal IN and the output of the amplifier circuit 10 that is fed back through the switch circuit 13 and the feedback circuit 11, and applies the signal obtained by the addition to the input terminal of the amplifier circuit 10. The amplifier circuit 10 amplifies the input signal at the input terminal to output the signal obtained by the amplification at the output terminal. The gain of the amplifier circuit 10 and the phase and gain of the feedback circuit 11 are set such as to cause the harmonic oscillator circuit to oscillate at desired frequency. It may be noted that the harmonic oscillator circuit oscillates in either one of the two operating states, i.e., the operating state in which noise from a noise source subjected to evaluation is applied to the input terminal IN and the operating state in which noise from the noise source subjected to evaluation is not applied to the input terminal IN.

Figure 2:
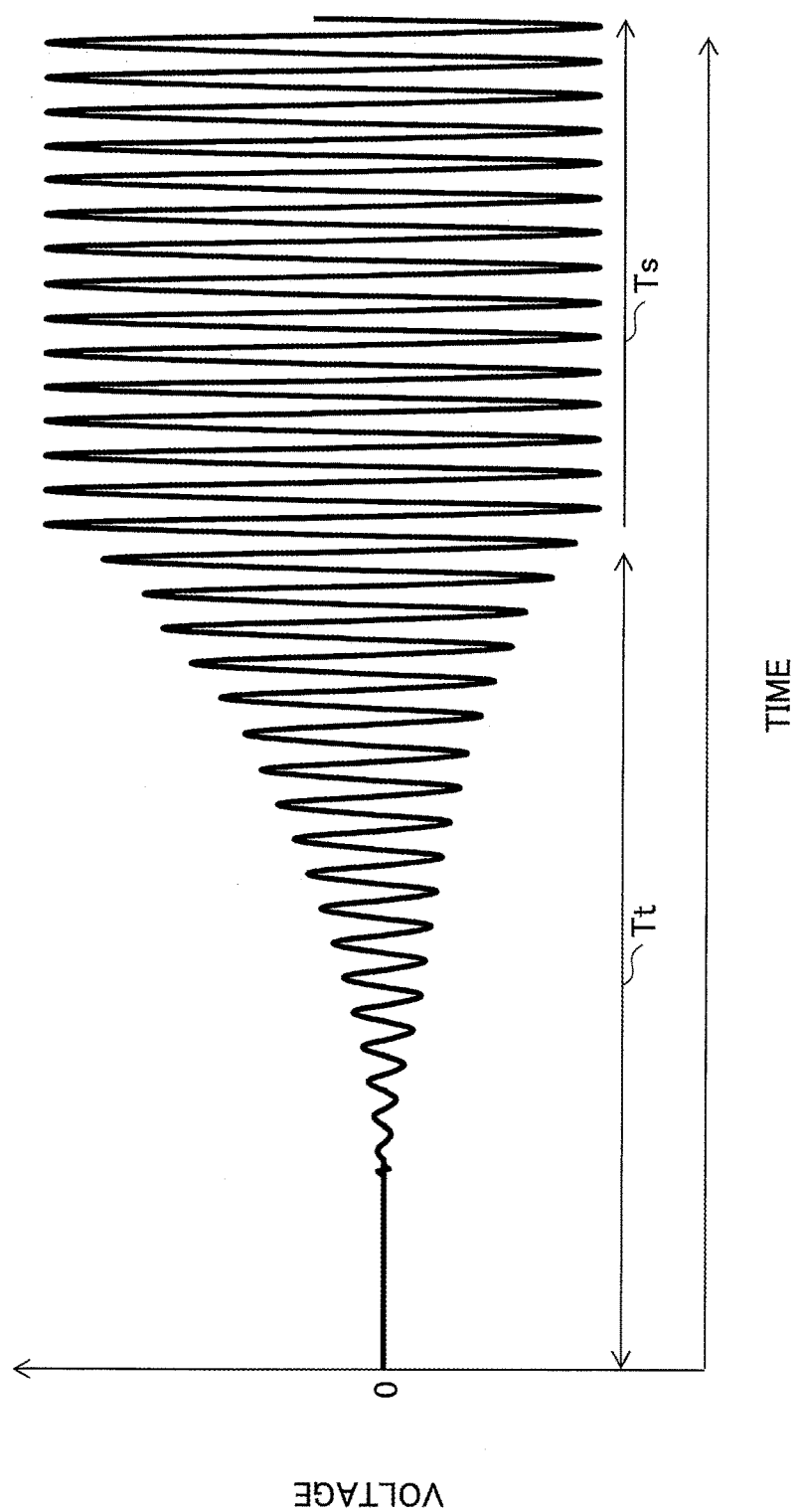
FIG. 2 is a drawing illustrating the way the harmonic oscillator circuit oscillates in the case of no noise being applied.

FIG. 2 is a drawing illustrating the way the harmonic oscillator circuit oscillates in the case of no noise being applied. In the harmonic oscillator circuit illustrated in FIG. 1, only the natural thermal noise is in existence when noise from the noise source subjected to evaluation is not applied to the input terminal IN. At a room temperature of 300 K, power P of the natural thermal noise is expressed in units of decibels as follows:

$$P = -174 + 10 \log(\Delta f) \quad (1)$$

Here, $\Delta f$ is a bandwidth. The natural thermal noise, which exists all the time even in the case of no noise from a noise source being applied, is amplified by the amplifier circuit 10 and fed back, resulting in being amplified repeatedly in the feedback loop. Noise thus gradually increases as time passes, i.e., with the passage of each cycle in which a signal propagates once around the feedback loop. As a result, the output voltage of the amplifier circuit 10 gradually increases.

In FIG. 2, a period Tt represents a transient period in which the output voltage of the amplifier circuit 10 continues to increase. A period Ts is a stationary period in which the output voltage of the amplifier circuit 10 stays at a fixed level after having reached the saturation voltage of the amplifier circuit 10.

Figure 3:
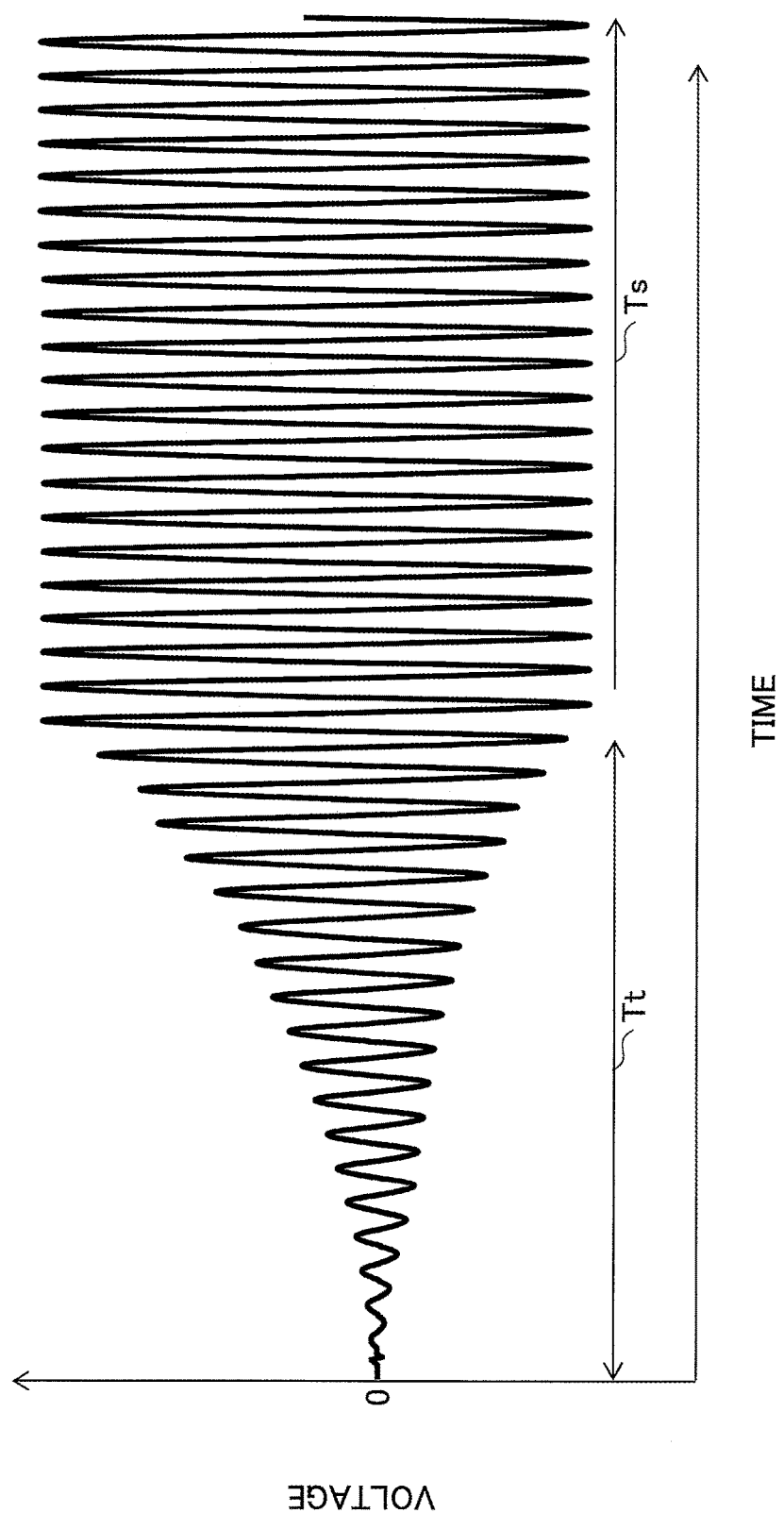
FIG. 3 is a drawing illustrating the way the harmonic oscillator circuit oscillates in the case of noise being applied.

FIG. 3 is a drawing illustrating the way the harmonic oscillator circuit oscillates in the case of noise being applied. In the harmonic oscillator circuit illustrated in FIG. 1, both the natural thermal noise and noise from a noise source subjected to evaluation are in existence when the noise from the noise source is applied to the input terminal IN. These noises are amplified by the amplifier circuit 10 and fed back, resulting in being amplified repeatedly in the feedback loop. These noises thus gradually increase as time passes, i.e., with the passage of each cycle in which a signal propagates once around the feedback loop. As a result, the output voltage of the amplifier circuit 10 gradually increases.

The transient period Tt in the case of noise being applied as illustrated in FIG. 3 is shorter than the transient period Tt in the case of no noise being applied as illustrated in FIG. 3. This is because the input voltage level in the initial state as well as the input voltage level in each feedback cycle are higher in the case of noise being applied than in the case of no noise being applied. Namely, the amplifier circuit 10 at the time of a start is at a higher level in the case of noise being applied than in the case of no noise being applied, and, also, a rate at which the voltage increases in each feedback cycle is also higher in the case of noise being applied than in the case of no noise being applied.

Figure 4:
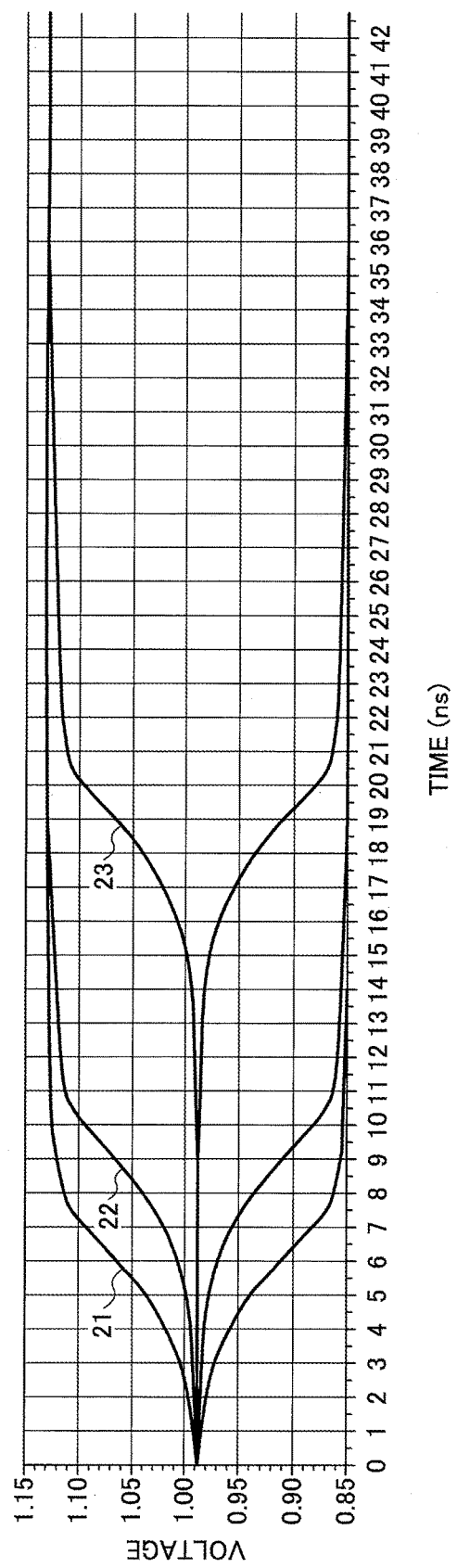
FIG. 4 is a drawing illustrating the way the time it takes for the harmonic oscillator circuit to reach a stationary state differs depending on the noise level.

FIG. 4 is a drawing illustrating the way the time it takes for the harmonic oscillator circuit to reach a stationary state differs depending on the noise level. Waveforms 21 through illustrated in FIG. 4 are the envelopes of oscillating signals of the harmonic oscillator circuit calculated by use of computer simulation. An LC oscillator is used as the harmonic oscillator circuit, with the oscillating frequency being 80 GHz and the loop gain being 0.2 dB. The waveform 21 is the envelope of the oscillating voltage waveform in the case of the amplitude voltage of the noise input from the noise source being 500 μV. The waveform 22 is the envelope of the oscillating voltage waveform in the case of the amplitude voltage of the noise input from the noise source being 100 μV. The waveform 23 is the envelope of the oscillating voltage waveform in the case of the amplitude voltage of the noise input from the noise source being 0 μV. To be more specific, the waveform 23 is the envelope of the oscillating voltage waveform in the state in which only the natural thermal noise is present.

As can be seen from the simulation results illustrated in FIG. 4, it takes approximately 34 nanoseconds for the amplitude of the oscillating voltage waveform to saturate and reach a stationary state in the case of only the natural thermal noise being present. In the case of the amplitude voltage of the noise input from the noise source being 100 μV, it takes approximately 18 nanoseconds for the amplitude of the oscillating voltage waveform to saturate and reach a stationary state. Further, in the case of the amplitude voltage of the noise input from the noise source being 500 μV, it only takes approximately 14 nanoseconds for the amplitude of the oscillating voltage waveform to saturate and reach a stationary state.

Accordingly, the measurement of a noise level is enabled by measuring the time it takes for the amplitude of the oscillating voltage waveform to saturate and reach a stationary state from the time of initiation of the oscillating state of the harmonic oscillator circuit. Further, the measurement of a noise level is also enabled by measuring the time it takes for the amplitude of the oscillating voltage waveform to reach a predetermined voltage value from the time of initiation of the oscillating state of the harmonic oscillator circuit, without waiting for the amplitude of the oscillating voltage waveform to saturate and reach a stationary state. For example, noise from a noise source that has a known noise level may be input into the harmonic oscillator circuit, followed by measuring the time it takes for the amplitude of the oscillating voltage waveform to reach a predetermined voltage value. Such measurements may be taken with respect to a plurality of different noise levels. Subsequently, noise from a noise source that has an unknown noise level is applied to the harmonic oscillator circuit. The noise level can then be estimated by checking which one of the previously measured time lengths different from each other is the closest to the time it takes for the amplitude of the oscillating voltage waveform to reach the predetermined voltage value.

Alternatively, the time it takes for the amplitude of the oscillating voltage waveform to reach the predetermined voltage value may be measured in advance in the presence of only the natural thermal noise without the inputting of noise from a noise source subjected to measurement. Thereafter, noise from a noise source (i.e., noise source subjected to measurement) that has an unknown noise level may be applied to the harmonic oscillator circuit. The time it takes for the amplitude of the oscillating voltage waveform to reach the predetermined voltage value may then be measured. The noise level may be theoretically estimated based on this measured time length and the time length previously measured in the presence of only the natural thermal noise, as will be described later.

Figure 5:
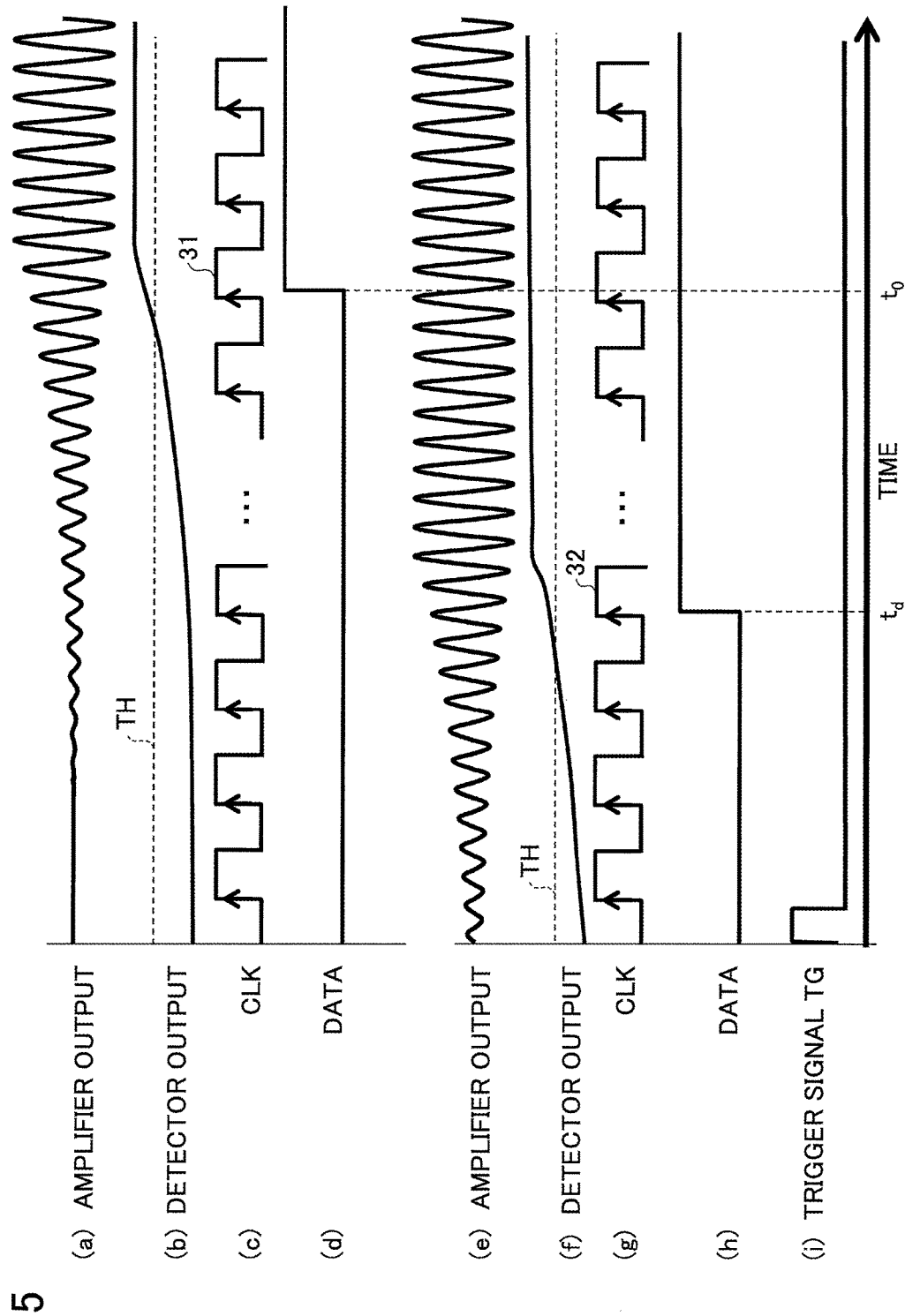
FIG. 5 is a drawing illustrating a method of measuring a noise level by use of a harmonic oscillator circuit.

FIG. 5 is a drawing illustrating a method of measuring a noise level by use of a harmonic oscillator circuit. In FIG. 5, the letter designation (a) denotes the output of the amplifier (i.e., the output of the amplifier circuit), and the letter designation (b) denotes the output of a wave detector (i.e., the output of a wave detector circuit), with the letter designations (c) and (d) denoting a clock signal CLK and a data detection result DATA, respectively, all of which are waveforms observed in the case of no noise being input from a noise source. Further, the letter designation (e) denotes the output of the amplifier (i.e., the output of the amplifier circuit), and the letter designation (f) denotes the output of a wave detector (i.e., the output of a wave detector circuit), with the letter designations (g) and (h) denoting a clock signal CLK and a data detection result DATA, respectively, all of which are waveforms observed in the case of noise being input from a noise source. Moreover, the letter designation (i) denotes a trigger signal TG that causes the harmonic oscillator circuit to start oscillating. The method of measuring a noise level as illustrated in FIG. 5 will be described after the configuration of a semiconductor integrated circuit for measuring a noise level is described.

Figure 6:
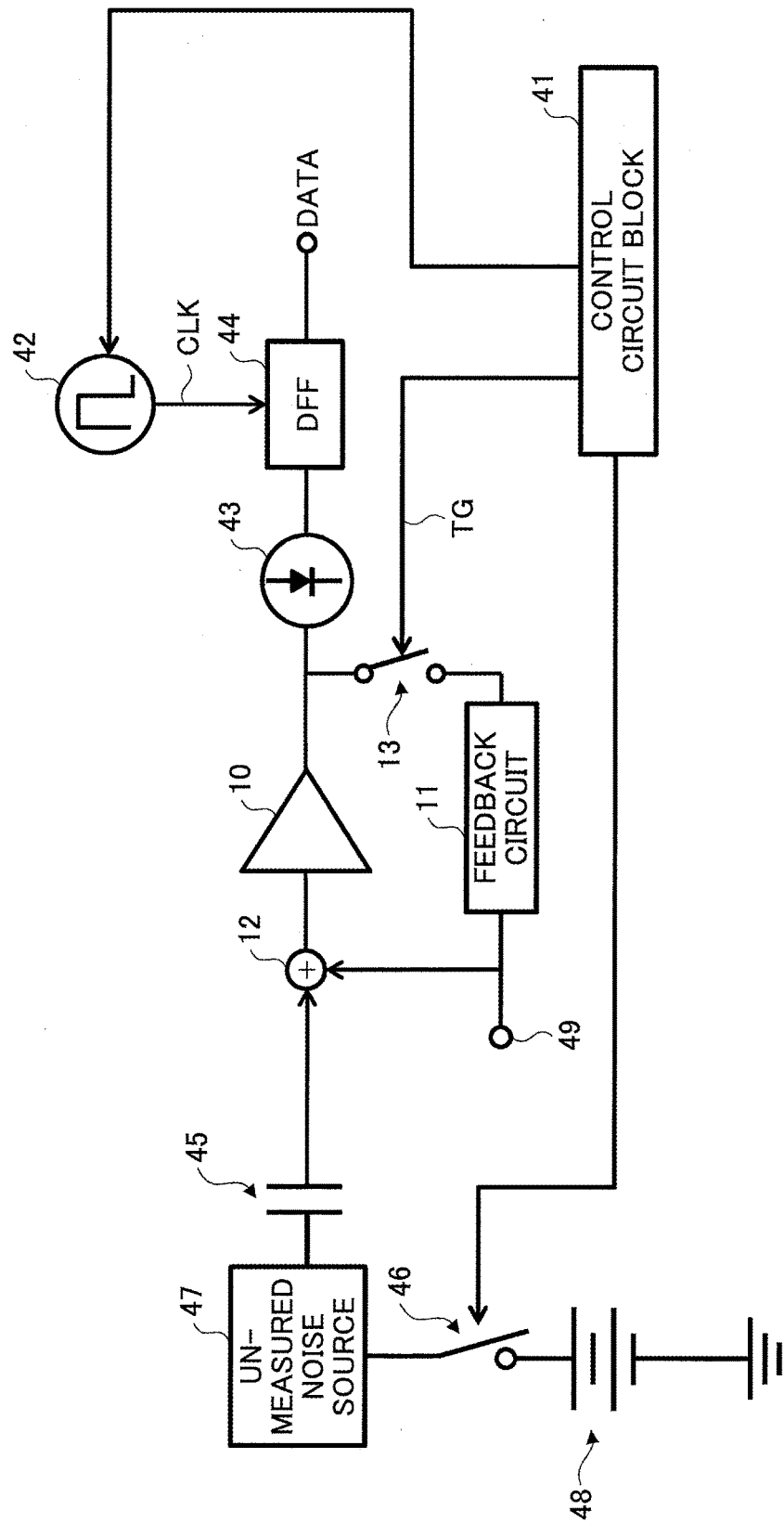
FIG. 6 is a drawing illustrating an example of the configuration of a semiconductor integrated circuit that measures a noise level by use of a harmonic oscillator circuit.

FIG. 6 is a drawing illustrating an example of the configuration of a semiconductor integrated circuit that measures a noise level by use of a harmonic oscillator circuit. The use of the semiconductor integrated circuit illustrated in FIG. 6 enables the method of measuring a noise level illustrated in FIG. 5 to be performed to measure a noise level.

The semiconductor integrated circuit illustrated in FIG. 6 includes the amplifier circuit 10, the feedback circuit 11, the adder circuit 12, and the switch circuit 13 as the harmonic oscillator circuit illustrated in FIG. 1. The semiconductor integrated circuit further includes a control circuit block 41, a clock generating circuit 42, a detector circuit 43, a decision circuit (DFF) 44, a capacitance element 45, a switch circuit 46, and an unmeasured noise source 47. Boundaries between functional or circuit blocks illustrated as boxes basically indicate functional boundaries, and may not correspond to separation in terms of physical positions, separation in terms of electrical signals, separation in terms of control logic, etc. Each functional or circuit block may be a hardware module that is physically separated from other blocks to some extent, or may indicate a function in a hardware module in which this and other blocks are physically combined together.

Although the configuration of the semiconductor integrated circuit illustrated in FIG. 6 has the control circuit block 41 and the clock generating circuit 42 disposed inside the semiconductor integrated circuit, this is only a non-limiting example. At least one of the control circuit block 41 and the clock generating circuit 42 may be disposed outside the semiconductor integrated circuit, thereby supplying a clock signal to the semiconductor integrated circuit from an external apparatus, or controlling the switch circuit 13 and the switch circuit 46 from an external apparatus.

As in FIG. 1, the harmonic oscillator circuit includes the amplifier circuit 10, the feedback circuit 11, and the adder circuit 12. The switch circuit 13 is a first switch circuit for causing the oscillating state of the harmonic oscillator circuit to switch between the "on" state and the "off" state. The switch circuit 13 may be regarded as part of the harmonic oscillator circuit, or may be regarded as a circuit element external to the harmonic oscillator circuit. The control circuit block 41 controls the switch circuit 13 as to the conductive state and nonconductive state thereof. As the control circuit block 41 places the switch circuit 13 in the nonconductive state, the harmonic oscillator circuit stops oscillating. As the control circuit block 41 places the switch circuit 13 in the conductive state, the harmonic oscillator circuit starts oscillating. A MOS transistor, for example, may be used to implement the switch circuit 13.

The detector circuit 43 produces a voltage responsive to the amplitude of the oscillating output of the harmonic oscillator circuit (i.e., the output of the amplifier circuit 10). Specifically, the detector circuit 43 may be a wave detector circuit or rectifying circuit, and may perform half-wave rectification or full-wave rectification by use of a diode or the like, followed by smoothing the rectified waveform by use of a smoothing circuit or the like, thereby detecting the envelope of the oscillating output of the harmonic oscillator circuit.

The decision circuit 44 detects whether or not the output (i.e., output voltage) of the detector circuit 43 exceeds a threshold value in synchronization with the clock signal SLK. Specifically, the decision circuit 44 may be a flip-flop (D-flip-flop) that loads data in synchronization with the clock signal CLK. In the case of the flip-flop being used, the voltage level of the loaded data that exceeds a predetermined threshold level causes the loaded data to be "1", and the voltage level of the loaded data that falls below the predetermined threshold level causes the loaded data to be "0". The rectifying circuit and the flip-flop are used to detect a point in time at which the loaded data of the flip-flop becomes "1", which enables the easy measurement of a point in time at which the amplitude of the oscillating output voltage of the harmonic oscillator circuit reaches and exceeds the threshold level.

The switch circuit 46 serves to control whether or not to apply the noise from the unmeasured noise source 47 to the harmonic oscillator circuit. The control circuit block 41 controls the switch circuit 46 as to the conductive state and nonconductive state thereof. In the example illustrated in FIG. 6, the switch circuit 46 causes the path between the unmeasured noise source and a power supply circuit 48 to switch between the conductive state and the nonconductive state. The nonconductive state of the switch circuit 46 set by the control circuit block 41 causes the unmeasured noise source 47 to be disconnected from the power supply and to stop operating. As a result, noise from the unmeasured noise source 47 is not applied to the harmonic oscillator circuit. The conductive state of the switch circuit 46 set by the control circuit block 41 causes the unmeasured noise source 47 to be connected to the power supply to operate. As a result, noise from the unmeasured noise source 47 is applied to the harmonic oscillator circuit. A MOS transistor, for example, may be used to implement the switch circuit 46.

The unmeasured noise source 47 may be coupled to the harmonic oscillator circuit through the capacitance element 45. The semiconductor integrated circuit for measuring a noise level as illustrated in FIG. 6 is designed to be embedded in an RF chip or the like, and the unmeasured noise source 47 may be an amplifier of the receiver circuit, for example. If this amplifier is directly connected to the noise-level measuring circuit illustrated in FIG. 6 all the time, such a connection may affect the operation of the receiver circuit. In order to make the effect of the noise-level measuring circuit on the receiver circuit or the like as small as possible, thus, it is preferable to electrically connect the unmeasured noise source 47 to the harmonic oscillator circuit through capacitive coupling by use of the capacitive element, rather than providing a direct wire connection.

In the following, a description will be given of the method of measuring a noise level by use of the noise-level measuring circuit illustrated in FIG. 6, with reference to FIG. 5 and FIG. 6.

The control circuit block 41 first makes the switch circuit 46 nonconductive, thereby placing the unmeasured noise source 47 in a state in which no noise is generated. In this state, only the natural thermal noise is applied to the harmonic oscillator circuit. In this state, the control circuit block 41 asserts the trigger signal TG supplied to the switch circuit 13, as illustrated in FIG. 5-(*i*), thereby placing the harmonic oscillator circuit in the oscillating state. Further, the control circuit block 41 causes the clock generating circuit 42 to generate the clock signal CLK in synchronization with the assertion of the trigger signal TG, as illustrated in FIG. 5-(*c*). With this arrangement, the harmonic oscillator circuit amplifies the natural thermal noise through the feedback loop, so that the amplitude of the oscillating output of the amplifier circuit 10 gradually increases as illustrated in FIG. 5-(*a*). The output of the detector circuit 43 illustrated in FIG. 5-(*b*) is the voltage (e.g., the voltage of the envelope) responsive to the amplitude of the oscillating output of the amplifier circuit 10, and gradually increases.

The decision circuit 44 detects the data indicated by the output voltage of the detector circuit 43 illustrated in FIG. 5-(*b*) at the rising edges, for example, of the clock signal CLK illustrated in FIG. 5-(*c*). Specifically, an output DATA of the decision circuit 44 illustrated in FIG. 5-(*d*) assumes "1" when the output of the detector circuit 43 at a rising edge of the clock signal CLK is larger than a predetermined threshold TH, and assumes "0" when the output is smaller than the predetermined threshold TH. In the example illustrated in FIG. 5, the output DATA of the decision circuit 44 illustrated in FIG. 5-(*d*) changes from "0" to "1" at a time t0.

The output DATA of the decision circuit 44 illustrated in FIG. 6 may be output to outside the semiconductor integrated circuit. The clock signal CLK generated by the clock generating circuit 42 may also be output to outside the semiconductor integrated circuit. An external apparatus may count the number of pulses of the clock signal CLK from the first pulse to the later pulse at which the output DATA changes to "1", thereby detecting the time it takes for the amplitude of the oscillating output to reach the predetermined threshold TH from the initiation of the oscillating operation.

Alternatively, a counter may be provided inside the control circuit block 41, and the clock signal CLK of the clock generating circuit 42 may be supplied to the control circuit block 41, so that the counter counts the number of pulses. A signal indicative of the pulse count may then be output to the outside. An external apparatus may identify the count value observed at the time at which the output DATA changes to "1", thereby detecting the time it takes for the amplitude of the oscillating output to reach the predetermined threshold TH from the initiation of the oscillating operation. Alternatively, the output DATA of the decision circuit 44 may be supplied to the control circuit block 41, which then identifies the count value observed at the time at which the output DATA changes to "1". The control circuit block 41 may then output the identified count value to the outside.

The generation of the clock signal CLK of the clock generating circuit 42 does not have to start in synchronization with the assertion of the trigger signal TG, and may start prior to the assertion of the trigger signal TG. In such a case, the time at which the oscillating operation of the harmonic oscillator circuit starts may be identified by monitoring the trigger signal TG. When an external apparatus is used to identify the time of initiation of the oscillating operation of the harmonic oscillator circuit, for example, provision may be made to output the trigger signal TG to outside the semiconductor integrated circuit. The external apparatus may count the number of pulses of the clock signal CLK from the time of assertion of the trigger signal TG to the time at which the output DATA of the decision circuit 44 changes to "1".

After the time measurement as described above is performed in the absence of noise from the unmeasured noise source 47, time measurement is further performed in the presence of noise from the unmeasured noise source 47. The order of such time measurements may be reversed. Namely, time measurement in the presence of noise may be performed first, followed by performing time measurement in the absence of noise.

The control circuit block 41 makes the switch circuit 46 conductive, thereby placing the unmeasured noise source 47 in a state in which noise is generated. In this state, the noise generated by the unmeasured noise source 47 and the natural thermal noise are applied to the harmonic oscillator circuit. In this state, the control circuit block 41 asserts the trigger signal TG supplied to the switch circuit 13, as illustrated in FIG. 5-(*i*), thereby placing the harmonic oscillator circuit in the oscillating state. Further, the control circuit block 41 causes the clock generating circuit 42 to generate the clock signal CLK in synchronization with the assertion of the trigger signal TG, as illustrated in FIG. 5-(*g*). With this arrangement, the harmonic oscillator circuit amplifies the noises through the feedback loop, so that the amplitude of the oscillating output of the amplifier circuit 10 gradually increases as illustrated in FIG. 5-(*e*). The output of the detector circuit 43 illustrated in FIG. 5-(*f*) is the voltage (e.g., the voltage of the envelope) responsive to the amplitude of the oscillating output of the amplifier circuit 10, and gradually increases.

The decision circuit 44 detects the data indicated by the output voltage of the detector circuit 43 illustrated in FIG. 5-(*f*) at the rising edges, for example, of the clock signal CLK illustrated in FIG. 5-(*g*). Specifically, the output DATA of the decision circuit 44 illustrated in FIG. 5-(*h*) assumes "1" when the output of the detector circuit 43 at a rising edge of the clock signal CLK is larger than a predetermined threshold TH, and assumes "0" when the output is smaller than the predetermined threshold TH. In the example illustrated in FIG. 5, the output DATA of the decision circuit 44 illustrated in FIG. 5-(*h*) changes from "0" to "1" at a time td.

Noise is calculated as follows, for example, based on the time t0 and the time td measured as described above. In the case of the room temperature being 300 K, the power of the natural thermal noise for a bandwidth of 1 Hz is −174 dBm as previously described. With the impedance of an output probing terminal 49 illustrated in FIG. 6 designed to be 50Ω, a voltage Vini of the natural thermal noise is obtained as follows.

$$Vini=(10^{-17.4}\times50)^{0.5}=1.41\times10^{-8} \quad (2)$$

In the presence of only the natural thermal noise as expressed by the above formula, the number of generated pulses of the clock signal CLK may be equal to N during the period from the initiation of the oscillation of the harmonic oscillator circuit to the time at which the output DATA of the decision circuit 44 changes to "1" upon the output of the detector circuit 43 exceeding the predetermined threshold TH. It may further be assumed that the frequency of the clock signal CLK is equal to the oscillating frequency of the harmonic oscillator circuit, and a voltage value corresponding to the threshold TH is VTH, with the loop gain of the harmonic oscillator circuit being equal to G. In such a case, the following relationship is satisfied.

$$VTH=(G^N+G^{N-1}+G^{N-2}+\ldots+G^2+G+1)Vini \quad (3)$$

The reason why VTH is not equal to Vini multiplied by $G^N$, but is expressed as in the above formula is that the natural thermal noise having the voltage Vini is present all the time in addition to in the initial state, and is added to the result of amplification obtained at each cycle.

In the presence of the noise having a voltage Vn from the unmeasured noise source 47, the number of generated pulses of the clock signal CLK may be equal to M during the period from the initiation of the oscillation of the harmonic oscillator circuit to the time at which the output DATA of the decision circuit 44 changes to "1" upon the output of the detector circuit 43 exceeding the predetermined threshold TH. The frequency of the clock signal CLK may be equal to the oscillating frequency of the harmonic oscillator circuit, and a voltage value corresponding to the threshold TH may be VTH, with the loop gain of the harmonic oscillator circuit being equal to G. In such a case, the following relationship is satisfied.

$$VTH=(G^M+G^{M-1}+G^{M-2}+\ldots+G^2+G+1)Vn \quad (4)$$

It may be noted that Vn is sufficiently larger than Vini, so that the effect of Vini is negligible.

Obtaining the loop gain G from the formula (3) allows the noise voltage Vn of the unmeasured noise source 47 to be obtained from the formula (4) because VTH, G, and M are known. The noise voltage Vn obtained in this manner is a voltage value corresponding to the power in a bandwidth of 1 Hz.

It may be noted that the harmonic oscillator circuit amplifies frequency components in the vicinity of the oscillating frequency while not amplifying other frequency components. As was previously described, the unmeasured noise source 47 subjected to noise level evaluation may be an amplifier of a receiver circuit, for example. The noise that may need to be measured by use of the noise-level measuring circuit illustrated in FIG. 6 is a noise in the vicinity of the frequency at which the unmeasured noise source 47 operates during routine operations. Accordingly, the closed loop characteristics defined by the amplifier circuit 10 and the feedback circuit 11 of the harmonic oscillator circuit may be set such that the harmonic oscillator circuit oscillates at the frequency corresponding to the noise that may need to be measured by use of the harmonic oscillator circuit.

Figure 7:
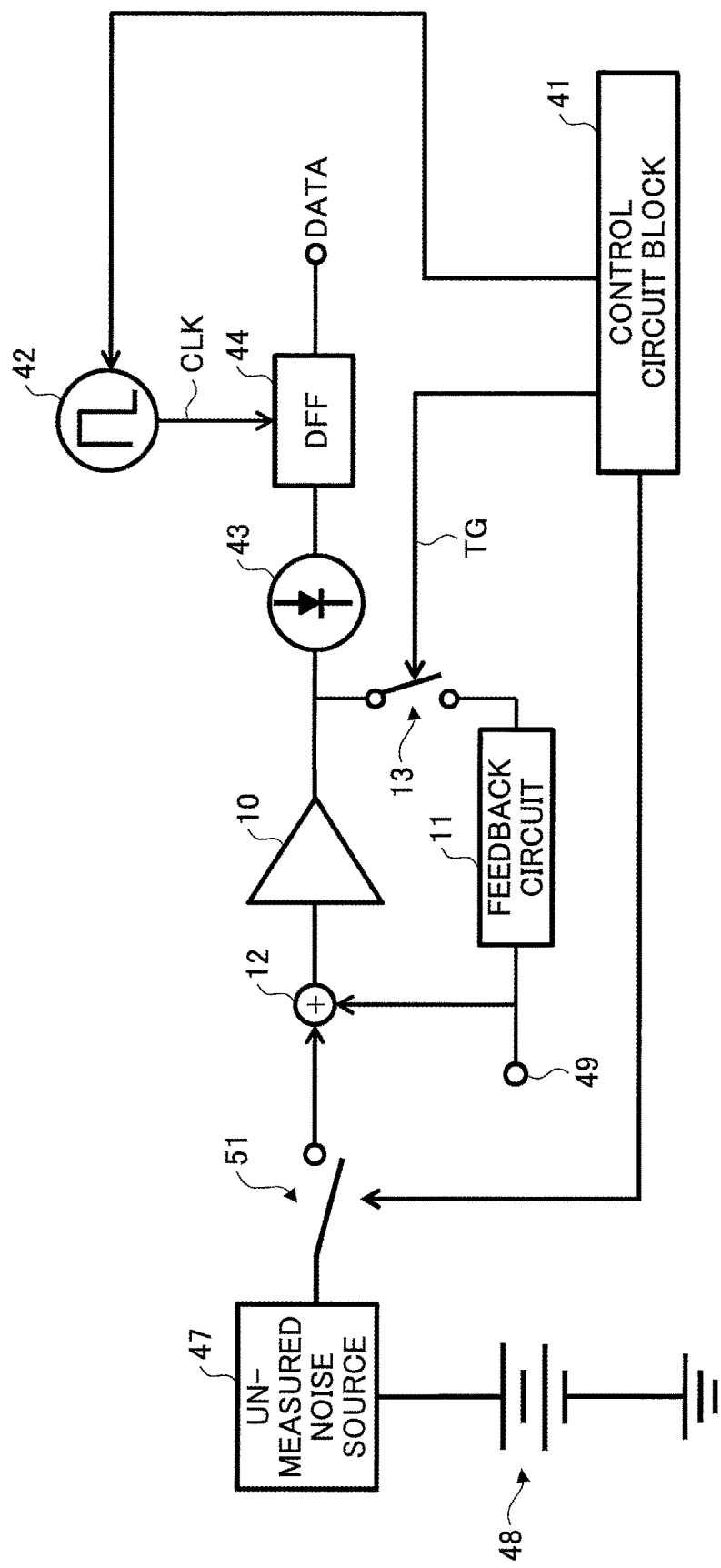
FIG. 7 is a drawing illustrating another example of the configuration of a semiconductor integrated circuit that measures a noise level by use of a harmonic oscillator circuit.

FIG. 7 is a drawing illustrating another example of the configuration of a semiconductor integrated circuit that measures a noise level by use of a harmonic oscillator circuit. In the semiconductor integrated circuit illustrated in FIG. 7, a switch circuit 51 is provided in place of the capacitance element 45 and the switch circuit 46 of the semiconductor integrated circuit illustrated in FIG. 6.

The switch circuit 51 serves to control whether or not to apply the noise from the unmeasured noise source 47 to the harmonic oscillator circuit. The control circuit block 41 controls the switch circuit 51 as to the conductive state and nonconductive state thereof. In the example illustrated in FIG. 7, the switch circuit 46 causes the path between the unmeasured noise source and the adder circuit 12 to switch between the conductive state and the nonconductive state. The nonconductive state of the switch circuit 51 set by the control circuit block 41 causes the harmonic oscillator circuit to be disconnected from the unmeasured noise source 47, so that the noise generated by the unmeasured noise source 47 is not applied to the harmonic oscillator circuit. The conductive state of the switch circuit 51 set by the control circuit block 41 causes the harmonic oscillator circuit to be connected to the unmeasured noise source 47, so that the noise generated by the unmeasured noise source 47 is applied to the harmonic oscillator circuit. A MOS transistor, for example, may be used to implement the switch circuit 51.

The control circuit block 41 causes the switch circuit 51 to switch between the conductive state and the nonconductive state in the manner described above so as to control whether or not to apply noise from the unmeasured noise source 47 to the harmonic oscillator circuit. With this arrangement, the time it takes for the output voltage of the detector circuit 43 to exceed a predetermined threshold from the initiation of oscillation is measured in both conditions, i.e., in the presence of noise from the noise source and in the absence of noise from the noise source. The semiconductor integrated circuit illustrated in FIG. 7 differs from the semiconductor integrated circuit illustrated in FIG. 6 only in the circuit configuration for switching between the presence of noise input and the absence of noise input. Other configurations and operations are the same or similar between these semiconductor integrated circuits.

Figure 8:
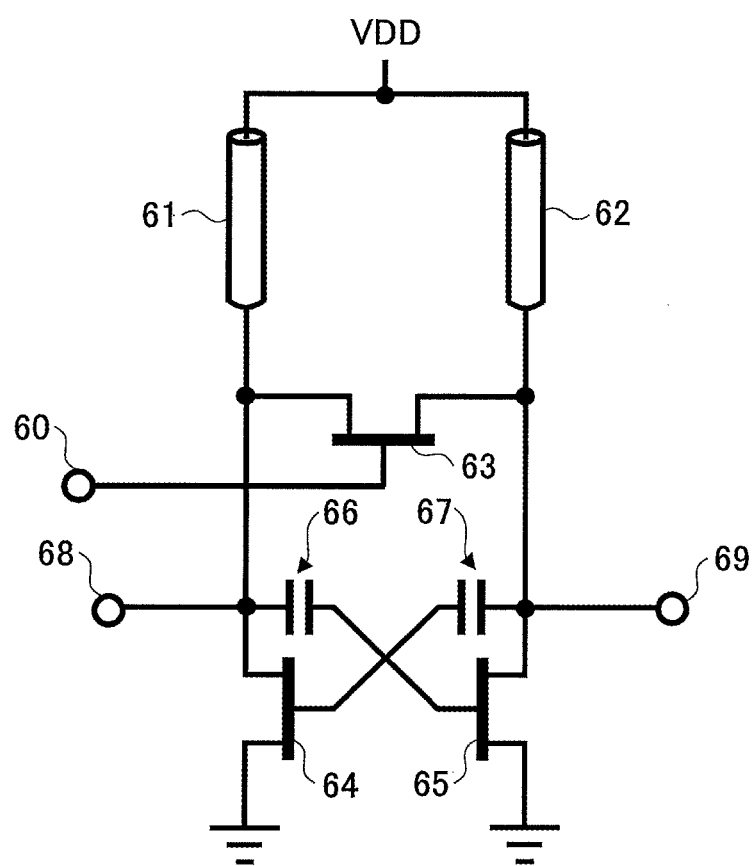
FIG. 8 is a drawing illustrating an example of the configuration of an LC oscillating circuit.

FIG. 8 is a drawing illustrating an example of the configuration of an LC oscillator circuit. The LC oscillator circuit illustrated in FIG. 8 includes inductors 61 and 62, MOS transistors 63 through 65, and capacitance elements 66 and 67.

The application of a HIGH signal to a control terminal 60 coupled to the gate of the MOS transistor 63 causes the MOS transistor 63 to become conductive, thereby causing the oscillating operation of the LC oscillator circuit to stop (i.e., to be set in the non-oscillating state). The application of a LOW signal to the control terminal causes the MOS transistor 63 to become nonconductive, thereby causing the oscillating operation of the LC oscillator circuit to start (i.e., to be set in the oscillating state). One of the terminals 68 and 69 may be used as an oscillation output terminal, and the other one may be used as a probing terminal for the oscillation output. The LC oscillator circuit as illustrated in FIG. 8 may be used as a harmonic oscillator circuit illustrated in FIG. 6 or FIG. 7.

Figure 9:
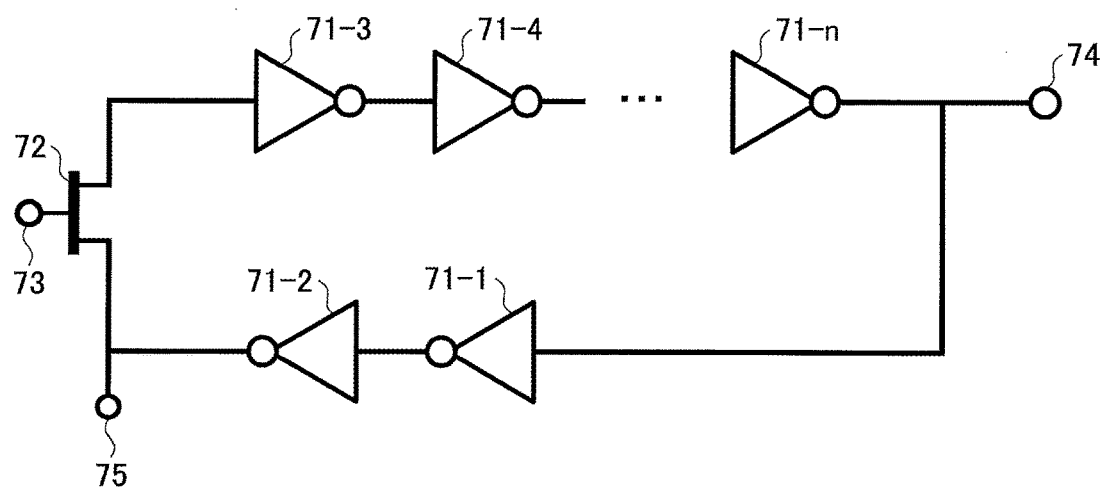
FIG. 9 is a drawing illustrating an example of the configuration of a ring oscillator circuit.

FIG. 9 is a drawing illustrating an example of the configuration of a ring oscillator circuit. The ring oscillator circuit illustrated in FIG. 9 includes n (n: odd integer) inverters 71-1 through 71-n and a MOS transistor 72.

The application of a LOW signal to a control terminal 73 coupled to the gate of the MOS transistor 72 causes the MOS transistor 72 to become nonconductive, thereby causing the oscillating operation of the ring oscillator circuit to stop (i.e., to be set in the non-oscillating state). The application of a HIGH signal to the control terminal 73 causes the MOS transistor 72 to become conductive, thereby causing the oscillating operation of the ring oscillator circuit to start (i.e., to be set in the oscillating state). A terminal 74 may be used as an oscillation output terminal, and a terminal 75 may be used as a probing terminal. The ring oscillator circuit as illustrated in FIG. 9 may be used as a harmonic oscillator circuit illustrated in FIG. 6 or FIG. 7.

Figure 10:
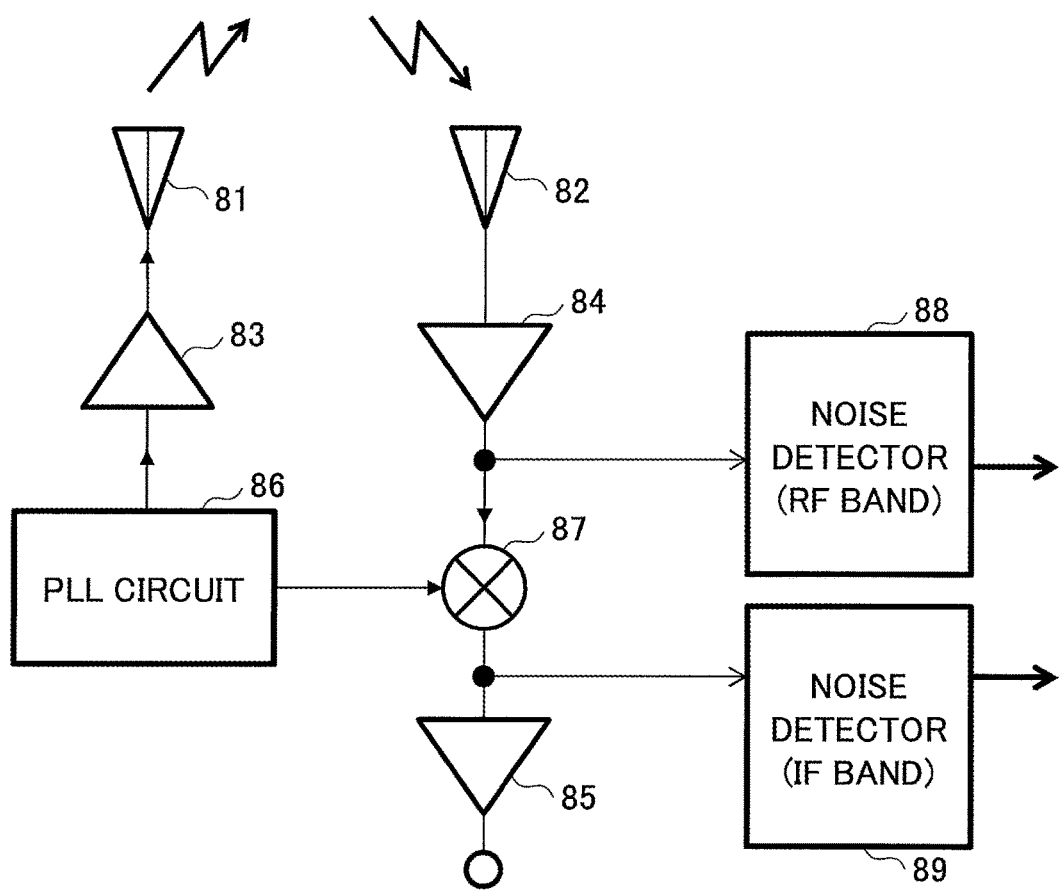
FIG. 10 is a drawing illustrating an example of the configuration of a transceiver inclusive of a noise detector.

FIG. 10 is a drawing illustrating an example of the configuration of a transceiver inclusive of a noise detector. The transceiver illustrated in FIG. 10 includes antennas 81 and 82, an amplifier 83, a low-noise amplifier 84, an intermediate frequency amplifier 85, a PLL (phase-locked loop) circuit 86, a mixer circuit 87, a noise detector 88, and a noise detector 89. This transceiver may be a radio-wave transmitter and receiver circuit of an automotive radar, for example.

A transmission signal generated by the PLL circuit 86 is amplified by the amplifier 83, and the amplified transmission signal is supplied to the antenna 81, which transmits transmission waves. A wave signal received by the antenna 82 is amplified by the low-noise amplifier 84, and the mixer circuit 87 multiplies the amplified received signal by a reference signal supplied from the PLL circuit 86. The signal obtained by the multiplication is amplified by the intermediate frequency amplifier 85, and the amplified signal is supplied to a signal processing circuit or the like disposed at the next stage.

The noise detector 88 coupled to the output of the low-noise amplifier 84 may have the same or similar configuration as the noise-level measuring circuit illustrated in FIG. 6 or FIG. 7. In this case, the low-noise amplifier 84 serves as the unmeasured noise source 47 illustrated in FIG. 6 or FIG. 7. The oscillating frequency of the harmonic oscillator circuit of the noise detector 88 may be designed to overlap the frequency band of the output signal of the low-noise amplifier 84, i.e., the frequency band of the RF (radio frequency) signals that are the received signals.

The noise detector 89 coupled to the output of the mixer circuit 87 may have the same or similar configuration as the noise-level measuring circuit illustrated in FIG. 6 or FIG. 7. In this case, the mixer circuit 87 serves as the unmeasured noise source 47 illustrated in FIG. 6 or FIG. 7. The oscillating frequency of the harmonic oscillator circuit of the noise detector 89 may be designed to overlap the frequency band of the output signal of the mixer circuit 87, i.e., the frequency band of the intermediate frequencies.

According to at least one embodiment, noise levels in a semiconductor integrated circuit can be measured at low cost.

Further, the present invention is not limited to these embodiments, but various variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor integrated circuit, comprising:
   a harmonic oscillator circuit;
   a first switch circuit configured to cause an oscillating state of the harmonic oscillator circuit to switch between an "on" state and an "off" state;
   a detector circuit configured to produce a voltage responsive to an amplitude of the oscillating output of the harmonic oscillator circuit;
   a decision circuit configured to detect whether the voltage produced by the detector circuit exceeds a threshold in synchronization with a clock signal; and
   a second switch circuit configured to cause the harmonic oscillator circuit to oscillate in a first state in which noise from a noise source is not applied to the harmonic oscillator circuit, and configured to cause the harmonic oscillator circuit to oscillate in a second state in which noise from the noise source is applied to the harmonic oscillator circuit.

2. The semiconductor integrated circuit as claimed in claim 1, wherein the second switch circuit is configured to control whether to make or break a connection between the noise source and the harmonic oscillator circuit.

3. The semiconductor integrated circuit as claimed in claim 1, wherein the second switch circuit is configured to control whether or not to apply power to the noise source.

4. The semiconductor integrated circuit as claimed in claim 1, wherein the detector circuit is a rectifying circuit, and the decision circuit is a flip-flop.

5. A semiconductor integrated circuit, comprising:
   a first noise detecting circuit; and
   a second noise detecting circuit,
   wherein each of the first noise detecting circuit and the second noise detecting circuit includes:
   a harmonic oscillator circuit;
   a first switch circuit configured to cause an oscillating state of the harmonic oscillator circuit to switch between an "on" state and an "off" state;
   a detector circuit configured to produce a voltage responsive to an amplitude of the oscillating output of the harmonic oscillator circuit;
   a decision circuit configured to detect whether the voltage produced by the detector circuit exceeds a threshold in synchronization with a clock signal; and
   a second switch circuit configured to cause the harmonic oscillator circuit to oscillate in a first state in which noise from a noise source is not applied to the harmonic oscillator circuit, and configured to cause the harmonic oscillator circuit to oscillate in a second state in which noise from the noise source is applied to the harmonic oscillator circuit,
   wherein an oscillating frequency of the harmonic oscillator circuit of the first noise detecting circuit and an oscillating frequency of the harmonic oscillator circuit of the second noise detecting circuit are different from each other.

6. A method for measuring noise, comprising:
   initiating an oscillation of a harmonic oscillator circuit in a first state in which noise from a noise source is not applied to the harmonic oscillator circuit;
   measuring, in the first state, a time length from the initiation of the oscillation to a point in time at which an output of the harmonic oscillator circuit first exceeds a predetermined threshold;

initiating an oscillation of the harmonic oscillator circuit in a second state in which noise from the noise source is applied to the harmonic oscillator circuit; and measuring, in the second state, a time length from the initiation of the oscillation to a point in time at which an output of the harmonic oscillator circuit first exceeds the predetermined threshold.

* * * * *